United States Patent [19]
Gibson

[11] Patent Number: 5,946,181
[45] Date of Patent: Aug. 31, 1999

[54] THERMAL SHUTDOWN CIRCUIT AND METHOD FOR SENSING THERMAL GRADIENTS TO EXTRAPOLATE HOT SPOT TEMPERATURE

[75] Inventor: Gary S. Gibson, Tucson, Ariz.

[73] Assignee: Burr-Brown Corporation, Tucson, Ark.

[21] Appl. No.: 08/928,837

[22] Filed: Sep. 12, 1997

Related U.S. Application Data

[60] Provisional application No. 60/045,223, Apr. 30, 1997.

[51] Int. Cl.$^6$ .................................................. H02H 5/04
[52] U.S. Cl. ................................. 361/103; 323/907
[58] Field of Search ............................... 361/57, 93, 94, 361/98, 103; 330/289; 327/513; 323/312–317, 907

[56] References Cited

U.S. PATENT DOCUMENTS

| | | | |
|---|---|---|---|
| 3,622,849 | 11/1971 | Kelley et al. | 317/33 SC |
| 4,207,481 | 6/1980 | Dobkin | 307/310 |
| 4,741,476 | 5/1988 | Russo et al. | 236/46 R |
| 4,924,112 | 5/1990 | Anderson et al. | 307/270 |
| 4,952,865 | 8/1990 | Pataut et al. | 323/313 |
| 4,990,864 | 2/1991 | Kwan | 323/315 |
| 5,039,878 | 8/1991 | Armstrong et al. | 307/310 |
| 5,206,778 | 4/1993 | Flynn et al. | 361/103 |
| 5,255,149 | 10/1993 | Matsuo | 361/103 |
| 5,267,118 | 11/1993 | Marshall et al. | 361/103 |
| 5,291,607 | 3/1994 | Ristic et al. | 395/750 |
| 5,444,219 | 8/1995 | Kelly | 219/505 |
| 5,471,173 | 11/1995 | Moore et al. | 330/256 |
| 5,519,354 | 5/1996 | Andy | 327/512 |
| 5,563,760 | 10/1996 | Lowis et al. | 361/103 |
| 5,585,995 | 12/1996 | Baurand et al. | 361/103 |

*Primary Examiner*—Ronald W. Leja
*Attorney, Agent, or Firm*—Cahill, Sutton & Thomas P.L.C.

[57] ABSTRACT

A circuit provides at least partial thermal shutdown of an integrated circuit chip including a functional circuit (7) in response to detection of a hot spot in a first area of the chip. First (Q1) and second (Q3) transistors in a second area (3) of the chip are located a first distance (10) from the second area of the chip, and third (Q4) and fourth (Q2) transistors in a third area (4) of the chip are located a second distance (11) substantially greater than the first distance from the first area. The functional circuit (7) dissipates power in the first area, causing a temperature in the hot spot to rise to approximately a first temperature T3 and causing the temperature of the first and second transistors to be a second temperature T2 and causing the temperature of the third and fourth transistors to be a third temperature T1. The first, second, third and fourth transistors are operated to in effect extrapolate between the second T2 and third T1 temperatures to produce a current (IOUT) proportional to the difference between the second T2 and third T1 temperature, and hence representative of the first temperature T3. At least a portion of the functional circuit turned off to reduce the temperature of the first region has a value that exceeds a predetermined maximum value.

15 Claims, 4 Drawing Sheets

THERMAL SHUTDOWN CIRCUIT AND METHOD FOR SENSING THERMAL GRADIENTS TO EXTRAPOLATE HOT SPOT TEMPERATURE

CROSS REFERENCE TO RELATED APPLICATION

This application claims the benefit of prior filed U.S. Provisional Application Serial No. 60/045,223, filed Apr. 30, 1997, now abandoned.

BACKGROUND OF THE INVENTION

The invention relates to a circuit and method for accurately measuring the temperature of a "hot spot" of a "functional circuit" in an integrated circuit semiconductor chip without diminishing the accuracy of the measurement and to accurately and predictably shut down at least a portion of the functional circuit when a predetermined maximum acceptable hot spot temperature is exceeded.

Excessive "hot spot" temperatures due to high power dissipation of a functional circuit in an integrated circuit chip can result in permanent circuit damage if the resulting excessive hot spot temperature is not promptly detected and reduced by turning off or powering down at least part of the functional circuit causing the power dissipation. Such hot spot temperatures usually are difficult to measure because they occur at locations where power dissipation is highest, and if additional sensing circuitry also is located in the high dissipation area to sense the resulting hot spot temperature, the very act of locating the sensing circuit reduces power density near the hot spot area and therefore tends to "corrupt" the measurement. Consequently it is difficult to provide a "thermal shutdown" which occurs at a consistent and predictable hot spot shutdown temperature. In the prior art, temperature sensing circuitry has been placed as close as possible to the "hot spot" area to achieve the most accurate hot spot temperature sensing capability. Another known technique is to deliberately set the threshold temperature at which a shutdown circuit is activated to a value lower than the actual desired maximum hot spot temperature. However, that approach is likely to result in "overdesign" of the integrated circuit chip, by making it larger and hence more costly than otherwise would be necessary to reduce power density, or in overdesign of the heat sinking structure, again resulting in higher cost.

U.S. Pat. No. 5,563,760 (Lowis, et al.) and U.S. Pat. No. 5,444,219 (Kelly) disclose temperature sensing circuits that include a first pair of resistors located close to an area in which the temperature is to be sensed, and a second pair of resistors located further from the area in which the temperature is to be sensed. The problem with this prior art approach, and also with prior art circuits in which PTAT (proportional to absolute temperature) circuits are located within a high power dissipation region, is that all of these prior art circuits reduce the power density in the hot spot region and thereby diminish the accuracy of measurement of the hot spot temperature and therefore do not result in a reliable, optimal thermal shutdown of the circuitry dissipating excessive power.

So called PTAT (proportional to absolute temperature) circuits which produce an output current that is proportional to the absolute temperature of the transistors constituting the circuit are well known. Ordinarily, the four transistors of a PTAT circuit are deliberately located as close together as possible so that the PTAT output current represents the absolute temperature of the silicon region in which those transistors are located, and no temperature gradients come into play in the design of prior PTAT circuits.

Thus, there is a presently unmet need for an improved circuit and technique for increasing the reliability and lifetime of integrated circuits having highly localized "hot spot" areas.

SUMMARY OF THE INVENTION

Accordingly, it is an object of the invention to provide a circuit and method for reliably, accurately determining when a hot spot temperature in an integrated circuit chip exceeds a predetermined level.

It is another object of the invention to provide an improved circuit and method for accurately determining when a hot spot temperature exceeds a predetermined level without reducing the power density near the region of the hot spot.

It is another object of the invention to provide an improved circuit and method for accurate, predictable partial or full thermal shutdown of a semiconductor device when a hot spot temperature exceeds a predetermined level.

It is another object of the invention to provide an improved technique for preventing damage to an integrated circuit due to overheating therein.

Briefly described, and in accordance with one embodiment thereof, the invention provides a circuit and technique of providing at least partial thermal shutdown of an integrated circuit chip including a functional circuit (7) in response to detection of a hot spot in a first area of the chip. First (Q1) and second (Q3) transistors are provided in a second area (3) of the chip located a first distance (10) from the second area of the chip, and third (Q4) and fourth (Q2) transistors are provided in a third area (4) of the chip located a second distance (11) substantially greater than the first distance from the first area. The functional circuit (7) dissipates power in the first area, causing a temperature in the hot spot to rise to approximately a first temperature T3 and causing the temperature of the first and second transistors to be a second temperature T2, and also causing the temperature of the third and fourth transistors to be a third temperature T1. The first, second, third and fourth transistors are operated to, in effect, extrapolate between the second and third temperatures T2 and T3, respectively, to produce a current (IOUT) having a component proportional to the difference between the second and third temperatures T2 and T1, respectively, and a component proportional to the absolute temperature of the average of T1 and T2, and hence representative of the first temperature T3. At least a portion of the functional circuit can be turned off or powered down to reduce the temperature of the first region if it exceeds a predetermined maximum desired temperature.

DETAILED DESCRIPTION OF THE PREFERRED EMBODIMENTS

Figure 1:
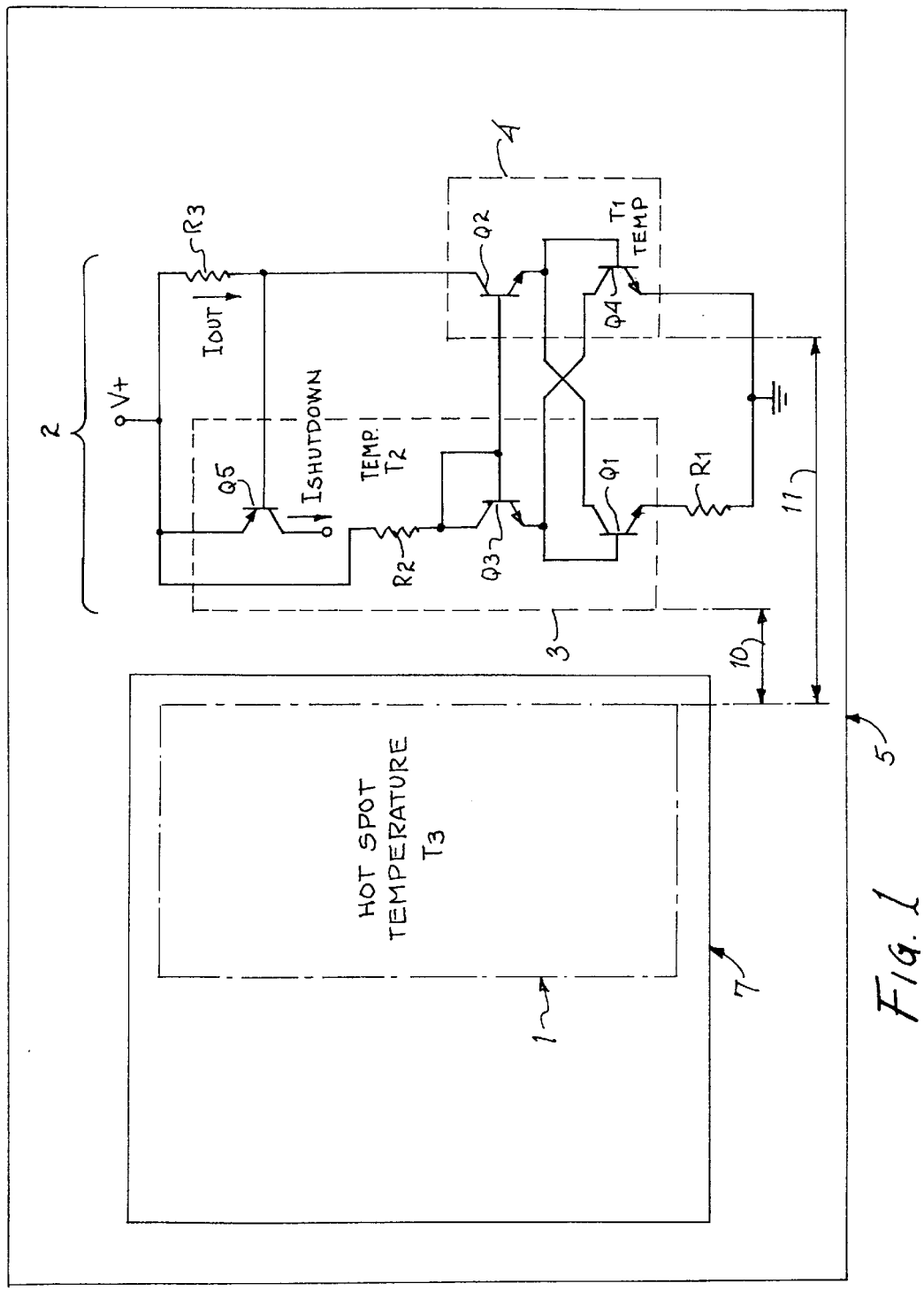
FIG. 1 is a diagram illustrating use of the "distributed" PTAT circuit of the present invention to effectuate thermal shutdown of circuitry on an integrated circuit chip to eliminate damage due to a hot spot in an adjacent region.

Referring to FIG. 1, integrated circuit chip 5 includes a functional circuit 7, such as a high powered operational amplifier. Functional circuit 7 is associated with an area 1 which contains, for example, an output transistor array for functional circuit 7. The output transistor array in area 1 generates therein a "hot spot" having a temperature T3. If T3 exceeds a predetermined maximum permissible value, for example 160 degrees Centigrade, it is necessary for the functional circuit 7 to be at least partially turned off or "powered down" in order to avoid damage to the transistors in the hot spot area 1.

Numeral 2 designates a thermal shutdown circuit that senses a thermal gradient across a portion of the chip 5 that is outside of section 1. Thermal shutdown circuit 2 includes NPN transistor Q1 having its emitter connected to one terminal of resistor R1, which may have a value of 359 ohms. The other terminal of resistor R1 is connected to ground. The base of transistor Q1 is connected to the emitter of NPN transistor Q3 and to the collector of NPN transistor Q4, the emitter of which is connected to ground. The base of transistor Q4 is connected to the emitter of NPN transistor Q2 and to the collector of transistor Q1. The collector of transistor Q3 is connected to its own base, the base of transistor Q2, and to one terminal of resistor R2, which can have a resistance of 36 kilohms. The other terminal of resistor R2 is connected to a supply voltage V+. The collector of transistor Q2 is connected to the base of PNP shutdown transistor Q5 and to one terminal of a 1.36 kilohms resistor R3. The other terminal of resistor R3 is connected to V+. The emitter of transistor Q5 is connected to V+. The collector of transistor Q5 is connected to partially or completely turn off the output transistor(s) in area 1 causing the hot spot.

Note that the basic circuit configuration of gradient sensing circuit 2 is not new. In fact, the configuration of gradient sensing circuit 2 is that of a well known PTAT (proportional to absolute temperature) circuit. However, in temperature gradient sensing circuit 2 transistors Q1 and Q3 in area 3 are located close together, and area 3 is located a distance 10 from area 1 of the chip. Preferably, shutdown transistor Q5 also is located in area 3. The temperature of area 3 and transistors Q1 and Q2 therein is T2 degrees. The circuit including transistors Q1 and Q3 in area 3, transistors Q2 and Q4 in area 4 spaced apart from area 3, and resistors R1 and R2 is referred to as a "distributed PTAT" circuit, in which there is a temperature gradient $\Delta T = T2 - T1$ between areas 3 and 4. This is significantly different than prior PTAT cells in which there is no such temperature gradient; the gradient $\Delta T$ produces an advantage, as explained subsequently.

Transistors Q2 and Q4 are located in an area 4 that is spaced a distance 11 from area 1. The temperature of area 4, and hence of transistors Q2 and Q4, is T1 degrees. The distances 10 and 11 can be roughly 7–8 mils and roughly 16 mils, respectively. The current $I_{OUT}$ through resistor R3 is a function of both the absolute temperature $(T1+T2)/2$ and the temperature gradient $\Delta T = T2 - T1$.

The high temperature T3 generated by the high power output transistor array in area 1 is the hot spot temperature.

The hot spot produces the temperature gradients described herein as heat travels away from the hot spot to cooler areas 3 and 4 of the integrated circuit chip 5. According to the present invention, transistor Q5 can be turned on when the hot spot temperature T3 reaches a predetermined threshold voltage if the emitter area ratios of transistors Q1, Q2, Q3, and Q4 and the distances 10 and 11 are chosen so that the shutdown circuit 2 effectively senses temperatures T2 and T1 to thereby produce $I_{OUT}$ as a function of both the temperature gradient $\Delta T$ and the absolute temperature $(T1+T2)/2$.

The value of resistor R3 is chosen so that the PTAT output current $I_{OUT}$ develops a sufficiently large voltage across resistor R3 to turn shutdown transistor Q5 on, causing it to produce the current $I_{SHUTDOWN}$ when the hot spot temperature in region 1 exceeds the predetermined maximum hot spot temperature T3, e.g. 160° C. The current $I_{SHUTDOWN}$ is then used to turn off the functional circuit 8 and hence the high power circuitry producing the hot spot in region 1, and thereby avoid damage to the circuitry in or close to the hot spot.

Figure 3:
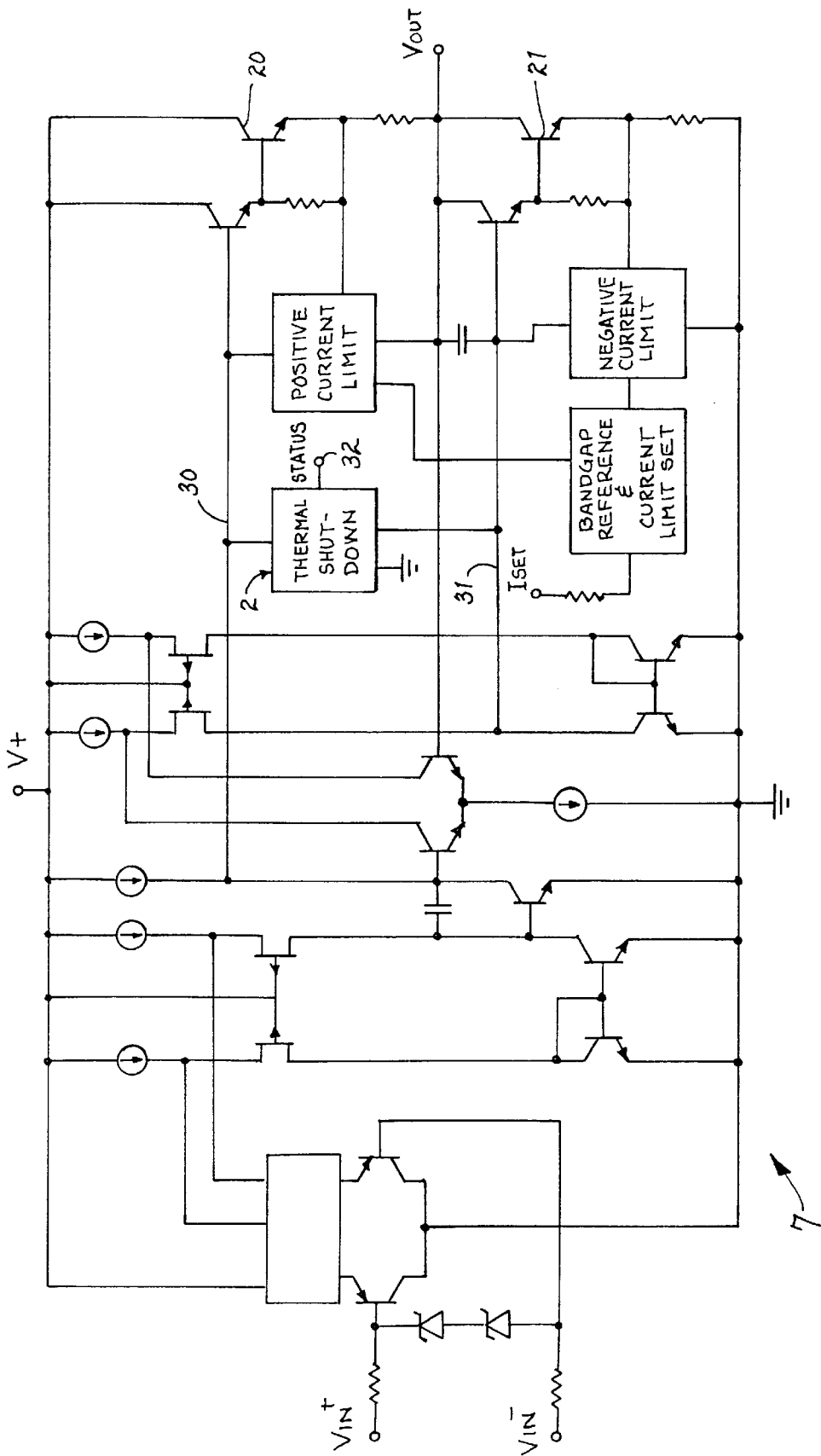
FIG. 3 is a schematic circuit diagram of a preferred embodiment of the invention constituting an integrated circuit high power operational amplifier.
Figure 5:
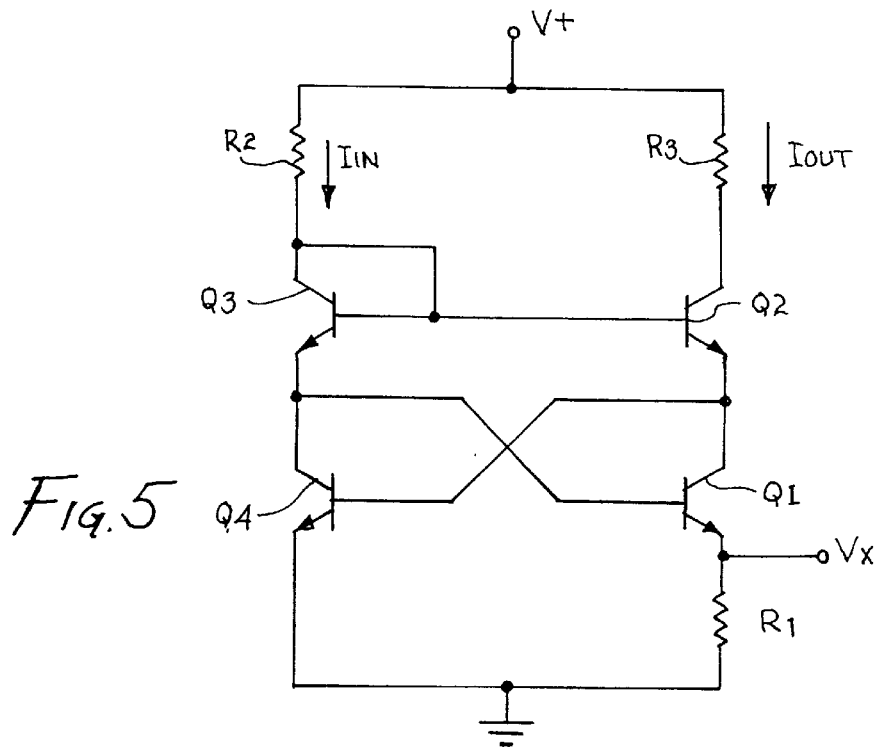
FIG. 5 is a redrawn schematic diagram of part of the circuitry shown in FIG. 1, provided for the purpose of explaining derivations of equations which pertain to the invention.

FIG. 3 shows a simplified schematic diagram of one embodiment of the integrated circuit chip 5 and a high power operational amplifier thereof. The portion of the diagram shown in FIG. 5 other than thermal shutdown circuit 2 and the output transistor array schematically shown by high power output transistors 20 and 21 constitutes functional circuit 7 of FIG. 1. Thermal shutdown circuit 2 includes circuitry (not shown) which converts the current $I_{SHUTDOWN}$ to control signals on conductors 30 and 31 to reduce the currents in high power output transistors 20 and 21 in hot spot area 1 when the hot spot temperature T3 therein exceeds the maximum desired hot spot temperature of, for example, 160 degrees Centigrade. Thermal shutdown circuit 2 also produces a status signal on conductor 32 in response to $I_{SHUTDOWN}$. The status signal can be monitored by a user to recognize when an excessively high hot spot temperature occurs. Conductor 32 also can be used by a user to externally control the operation of shutdown actuation circuitry by pulling node 32 low.

Figure 2:
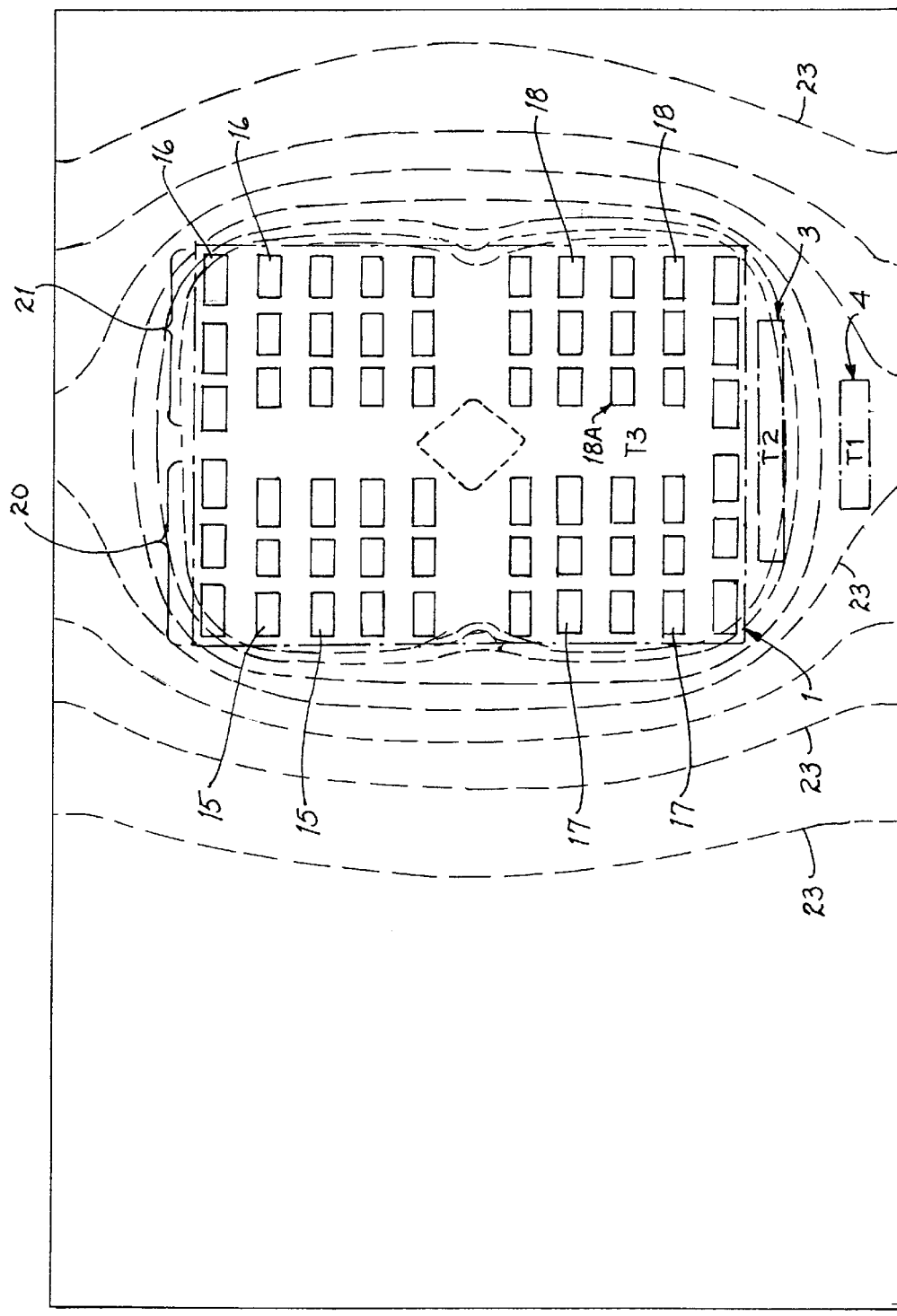
FIG. 2 is a diagram of a integrated circuit chip drawn approximately to scale showing locations of multiple emitters of a pair of output transistors of a high power operational amplifier and showing locations of isotherms produced by a computer simulation of the thermal characteristics of the operational amplifier.

FIG. 2 shows how the multiple rectangular emitters 15 and 17 of output transistor 20 (FIG. 3) are located in the left portion of area 1 (FIG. 1) and the emitters 16 and 18 of output transistor 21 are located in the right portion of area 1. The various continuous lines such as 23 are computer-simulated isotherms of the integrated circuit chip 5 when the output transistors 20 and 21 are operating at a power level that causes a hot spot temperature of approximately 160 degrees Centigrade to occur in emitter 17A, with the back side of the package in which chip 5 is packaged at an ambient temperature of 84° Centigrade. The isotherms illustrate the temperature gradient $\Delta T$ between areas 3 and 4 in FIG. 1 and the monotonicly decreasing nature of the temperature as it decreases from the maximum value of T3 in emitter 17A to the values T2 in area 3 and T1 in area 4.

The following material includes a derivation of the equations which describe the operation of the shutdown circuit of FIGS. 1 and 3. In reading this material it will be helpful to refer to FIG. 5, in which the "PTAT" portion of the circuit of FIG. 1 is redrawn to facilitate understanding of how the equations are derived. The voltage $V_x$ on the emitter of transistor Q1 is given by:

$$V_x = V_{BE(Q4)} + V_{BE(Q2)} - V_{BE(Q3)} - V_{BE(Q1)}. \quad \text{(Eq. 1)}$$

Assuming the transistor base currents are negligible, the output current $I_{OUT}$ is:

$$I_{OUT}=V_x/R1 \quad \text{(Eq. 2)}$$

Assuming that the transistor base currents are negligible, if all of transistors Q1, Q2, Q3 and Q4 are at same temperature, then the current in Q3, Q4 is $I_{IN}$. The current in transistors Q1 and Q2 is $I_{OUT}$.

For a bipolar transistor, the base-emitter voltage is $$V_{BE} \approx V_T \ln\left(\frac{IC}{IS}\right),$$

where $I_C$ is the collector current in the transistor and $I_S$ is the "saturation" current of that transistor and is proportional the emitter area thereof.

Therefore, the following expressions apply:

$$V_{BE(Q1)} = V_T \ln\left(\frac{I_{OUT}}{I_{S1}}\right)$$

$$V_{BE(Q2)} = V_T \ln\left(\frac{I_{OUT}}{I_{S2}}\right)$$

$$V_{BE(Q3)} = V_T \ln\left(\frac{I_{OUT}}{I_{S3}}\right)$$

$$V_{BE(Q4)} = V_T \ln\left(\frac{I_{OUT}}{I_{S4}}\right)$$

Substituting the foregoing expressions into Equation 1 results in:

$$V_x = V_T \ln\left(\frac{I_{IN}}{I_{S4}}\right) + V_T \ln\left(\frac{I_{OUT}}{I_{S2}}\right) - V_T \ln\left(\frac{I_{IN}}{I_{S3}}\right) - V_T \ln\left(\frac{I_{OUT}}{I_{S1}}\right),$$

when $$V_T = \frac{kT}{q}.$$

This expression simplifies to:

$$V_x = V_T \ln\left(\frac{I_{IN} \cdot I_{OUT} \cdot I_{S3} \cdot I_{S1}}{I_{S4} \cdot I_{S2} \cdot I_{IN} \cdot I_{OUT}}\right),$$

which further simplifies to:

$$V_x = V_T \ln\left(\frac{I_{S3} \cdot I_{S1}}{I_{S5} \cdot I_{S2}}\right). \quad \text{(Eq. 3)}$$

Setting $I_{S1}=A_1 I_S$, $I_{S2}=A_2 I_S$, $I_{S3}=A_3 I_S$, and $I_{S4}=A_4 I_S$, where $A_1$, $A_2$, $A_3$, $A_4$ are the emitter areas of transistors Q1, Q2, Q3, and Q4, respectively, then:

$$V_x = V_T \ln\left(\frac{A_3 A_1}{A_4 A_2}\right). \quad \text{(Eq. 4)}$$

Therefore, $I_{OUT}$ is given by:

$$I_{OUT} = V_x / R_1 = V_T \ln\left(\frac{A_1 A_3}{A_2 A_4}\right) / R_1. \quad \text{(Eq. 5)}$$

As an example, set the emitter area of transistor Q1 to 12 units of area, the emitter area of transistor Q3 to 3 units of area, the emitter area of transistor Q2 to 4 units of area, and the emitter area of transistor Q4 to 1 unit of area.

Then, $I_{OUT}$ is given by the expression:

$$I_{OUT} = \frac{V_T \ln\left(\frac{12 \cdot 3}{4 \cdot 1}\right)}{R_1}.$$

Then, for R1=359 ohms, $$I_{OUT} = \frac{V_T \ln(9)}{359}. \quad \text{(Eq. 6)}$$

Using Eq. 6, $I_{OUT}$ is 158 microamperes at 27 degrees Centigrade and 228 microamperes at 160 degrees Centigrade.

Note that for the above equations, under the stated assumptions, $I_{OUT}$ is a PTAT current, i.e., is proportional to absolute temperature.

Now, in accordance with the present invention, a first thermal gradient is present between T3 and T2 and a second thermal gradient $\Delta T$ is present between T2 and T1. This causes $I_{OUT}$ to be modified due to the difference in the $V_{BE}$ voltage of transistors Q1 and Q3 and the higher $V_{BE}$ voltages of transistors Q2 and Q4, which are at a lower temperature T1. $I_{OUT}$ is modified due to the temperature coefficient of base-to-emitter voltages. If this difference is accounted for by decreasing the $V_{BE}$ voltages of transistors Q1 and Q3 by 2.2 mV/° C., the new equation for $I_{OUT}$ becomes $$I_{OUT} = \frac{V_T \ln\left(\frac{A_1 A_3}{A_2 A_4}\right) + .0044(T2-T1)}{R_1} \quad \text{(Eq. 7)}$$

Substituting $$T_{AVG} = \frac{T2-T1}{2}$$

for T and $\Delta T = T2-T1$ in Eq. 7 results in $$I_{OUT} = \frac{V_{TAVG} \ln\left(\frac{A_1 A_3}{A_2 A_4}\right) + .0044 \Delta T}{R_1} \quad \text{(Eq. 8)}$$

Substituting $A_1=12$, $A_2=4$, $A_3=3$, $A_4=1$, $\Delta T=4.5°$ C., $T_{AVG}=133°$ C., and $R_1=1$ kilohm into Eq. 8 results in a value of $I_{OUT}$ equal to 269 microamperes.

Therefore, the gradient $\Delta T=4.5°$ C. achieved by providing the above distance T4 between areas 3 and 4 in effect boosts the $I_{OUT}$ by approximately 41 microamperes. Note that 41 microamperes times 1.36 kilohms is approximately equal to 55 millivolts and that 25° C. times 2.2 millivolts is equal to 55 millivolts, the amount that the $V_{BE}$ threshold voltage increases if Q5 is 25° C. cooler.

Equation 5 above is an expression for the PTAT output current $I_{OUT}$ of the thermal shutdown circuit 2 shown in FIG. 1. $V_T$ is the thermal voltage of a PN junction, and is equal to kT/q.

The $V_{BE}$ voltage of a PN junction decreases approximately 2.2 millivolts for each degree Centigrade of increase in the temperature of a PN junction for most silicon integrated circuit processes. The material following Eq. 5 above shows a derivation of Equation 8, which represents the output current $I_{OUT}$ expressed as a function of $\Delta T$ (which is equal to T2−T1), the emitter areas A1, A2, A3 and A4 of transistors Q1, Q2, Q3 and Q4, respectively, the resistance of resistor R1, and the average temperature $V_{Tavg}$, where $T_{AVG}$ is (T2+T1)/2.

Finally, the material after Eq. 8 shows that if the emitter area of transistor Q1 is 12 units of area, the emitter area of transistor Q3 is 3 units of area, the emitter area of transistor Q2 is 4 units of area, and the emitter area of transistor Q4 is 1 unit of area, and the hot spot temperature T3 is approximately 160 degrees centigrade, and R1 is 359 ohms, then $I_{OUT}$ is 269 microamperes, which is 41 microamperes greater than the value computed above if there is no temperature gradient ΔT, as in a conventional PTAT cell.

I believe that the new idea of separating the two areas 3 and 4 of the distributed PTAT circuit constituting thermal gradient-sensing circuit 2 is opposed to the prior art, in which transistors Q1, Q2, Q3 and Q4 of a PTAT cell ordinarily are deliberately positioned as close together as possible so that the PTAT output current $I_{OUT}$ represents the absolute temperature of the sense circuitry, rather than both the absolute temperature and the thermal gradient as in the present invention.

Figure 4:
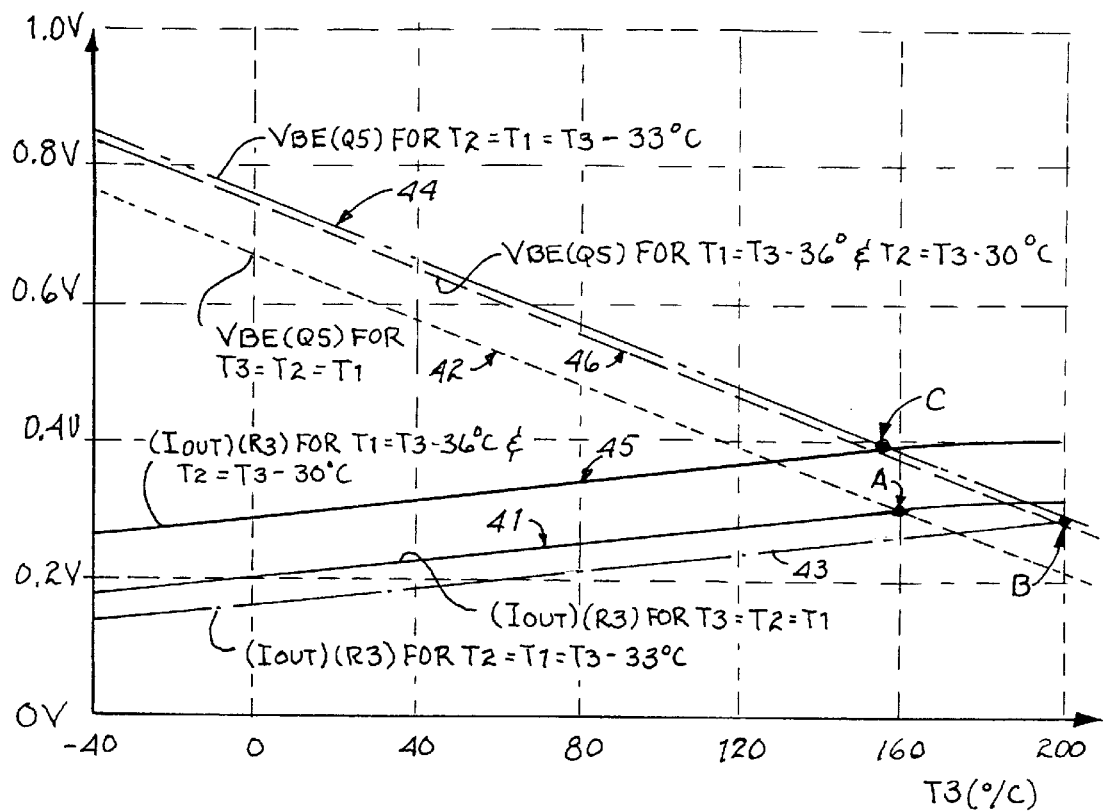
FIG. 4 is a graph useful in describing the invention.

The foregoing explanation, considered with the fact that transistor Q5 is turned off at low values of T3 below 160° Centigrade and is turned on when $I_{OUT} \times R3$ equals or exceeds $V_{BE(Q5)}$, is illustrated in the graph of FIG. 4. Curve 41 is a plot of $I_{OUT} \times R3$ if all four transistors Q1, Q2, Q3 and Q4 are at the same temperature T3. Curve 42 is a plot of the base-emitter turn-on voltage $V_{BE(Q5)}$ of transistor Q5 versus the hot spot temperature T3 if transistor Q5 is also at the hot spot temperature and if R3 is selected to turn Q5 on at about 160° Centigrade. Transistor Q5 turns on at point A where curves 41 and 42 intersect. Curve 41 increases with T3 because $I_{OUT}$ is proportional to absolute temperature and curve 42 decreases with T1=T2=T3 because the forward bias voltage of a PN junction characteristically decreases with temperature at the rate of approximately 2.2 millivolts per degree Centigrade.

On a plot of $V_{BE(Q5)}$ versus T3, where transistor Q5 is at temperature T2 which is cooler than the hot spot by ΔT=T3−T2, the value of $V_{BE(Q5)}$ needed to turn transistor Q5 on is higher than if transistor Q5 were at temperature T3. This ΔT would have the effect of shifting curve 42 in FIG. 4 upward on a plot of $V_{BE(Q5)}$ versus T3, to produce the curve 44 in FIG. 4 and that would cause curve 44 in FIG. 4 to intersect curve 43 at point B, which corresponds to a hot spot temperature T3 above 190° Centigrade, far higher than the 160° Centigrade hot spot temperature at which it is desired to shut down functional circuit 7.

In accordance with the present invention I also recognize that if the temperature gradient T2−T1 is provided by separating transistors Q2 and Q4 at temperature T1 in area 4 a distance from Q1 and Q3 at temperature T2 in area 3, for example, so that T1=T3−36° C. and T2=T3−30° C., this has the effect of shifting curve 41 in FIG. 4 upward to produce curve 45. Curve 45 intersects the curve 46 at the point C, at approximately the desired maximum hot spot temperature of 160° Centigrade.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A circuit for providing at least partial thermal shutdown of an integrated circuit chip including a functional circuit in response to detection of a hot spot temperature in a first area of the chip, comprising in combination:

(a) a distributed PTAT (proportional to absolute temperature) circuit including first and second transistors located in a second area of the chip located a first distance from the first area of the chip, and third and fourth transistors located in a third area of the chip located a second distance substantially greater than the first distance from the first area, the first transistor having an emitter coupled to a first terminal of a first resistor, a second terminal of the first resistor being coupled to a first supply voltage conductor, a base of the first transistor being coupled to an emitter of the second transistor and to a collector of the third transistor, an emitter of the third transistor being coupled to the first supply voltage conductor, a collector of the first transistor being coupled to an emitter of the fourth transistor and a base of the third transistor, a base and collector of the second transistor being coupled to a base of the fourth transistor and a first terminal of a second resistor, a second terminal of the second resistor being coupled to a second supply voltage conductor, the functional circuit dissipating power in the first area to cause a hot spot temperature in the first area and thereby also causing the temperature of the first and second transistors to be a second temperature and the temperature of the third and fourth transistors to be a third temperature;

(b) the first, second, third and fourth transistors and the first resistor operating to produce an output current having a component proportional to both an absolute temperature in a portion of the integrated circuit chip and the difference between the second and third temperatures, the output current thereby representing the hot spot temperature;

(c) a third resistor coupled between the second supply voltage conductor and a collector of the fourth transistor;

(d) a shutdown transistor having a base coupled to the collector of the fourth transistor to turn on the shutdown transistor if the hot spot temperature exceeds a predetermined value, a collector of the shutdown transistor being coupled to a control input of the functional circuit to reduce power dissipation in the first area when the hot spot temperature exceeds the predetermined value.

2. The circuit of claim 1 wherein the shutdown transistor is located in the second area.

3. The circuit of claim 2 wherein the first, second, third, and fourth transistors are of the same conductivity type.

4. The circuit of claim 1 wherein the first, second, third and fourth transistors are NPN transistors, and the shutdown transistor is a PNP transistor.

5. The circuit of claim 1 wherein the second area is approximately 8 mils from the first area.

6. The circuit of claim 5 wherein the second area is located between the first area and the third area, and the third area is roughly 15 mils from the first area.

7. A distributed PTAT (proportional to absolute temperature) integrated circuit, comprising in combination:

(a) a first transistor and a second transistor located adjacent to the first transistor;

(b) a third transistor and a fourth transistor located adjacent to the third transistor;

(c) a first resistor and a second resistor;

(d) the first, second, third and fourth transistors and the first and second resistors being interconnected to form a PTAT circuit producing a PTAT output current;

(e) a control transistor adjacent to the first and second transistors and coupled to operate in response to the PTAT output current;

(f) the third and fourth transistors being located a predetermined distance from the first and second transistors to thereby increase the PTAT output current and increase the magnitude of the base-to-emitter voltage of the control transistor so that the control transistor turns on at a lower temperature of a hot spot located a first distance from the first and second transistors and the control transistor, the third and fourth transistors being located further from the hot spot than the first and second transistors, whereby a collector current of the third transistor is proportional to both an absolute temperature in a portion of the integrated circuit and a gradient between a temperature of the first and second transistors and a temperature of the third and fourth transistors and thereby represents the temperature of the hot spot.

8. The distributed PTAT integrated circuit of claim 7 wherein the first, second, third, and fourth transistors are of the same conductivity type.

9. The distributed PTAT integrated circuit of claim 8 wherein an emitter of the first transistor is coupled by the first resistor to a first reference voltage conductor, a base of the first transistor is coupled to an emitter of the second transistor and a collector of the fourth transistor, a collector of the first transistor is coupled to an emitter of the third transistor and a base of the fourth transistor, an emitter of the fourth transistor is coupled to the first reference voltage conductor, a collector and base of the second transistor and a base of the third transistor being coupled by the second resistor to a second reference voltage conductor, a collector of the third transistor being coupled to the second reference voltage conductor.

10. The distributed PTAT integrated circuit of claim 9 wherein the collector of the third transistor is coupled by a third resistor to the second reference voltage conductor, and is also coupled to a base of the control transistor.

11. The distributed PTAT integrated circuit of claim 10 wherein an emitter of the control transistor is coupled to the second reference voltage conductor.

12. The distributed PTAT integrated circuit of claim 11 wherein the PTAT output current flows through the collector of the third transistor and the third resistor.

13. The distributed PTAT integrated circuit of claim 12 wherein the first, second, third and fourth transistors are NPN transistors, and the control transistor is a PNP transistor.

14. The distributed PTAT integrated circuit of claim 7 wherein the first and second transistors are approximately 8 mils from the hot spot.

15. The distributed PTAT integrated circuit of claim 14 wherein the first and second transistors are located between the hot spot and the third and fourth transistors, and the third and fourth transistors are roughly 15 mils from the hot spot.

* * * * *